(12) United States Patent
Okita et al.

(10) Patent No.: US 11,101,146 B2
(45) Date of Patent: Aug. 24, 2021

(54) SUBSTRATE PROCESSING APPARATUS

(71) Applicant: SCREEN Holdings Co., Ltd., Kyoto (JP)

(72) Inventors: Nobuaki Okita, Kyoto (JP); Ryo Muramoto, Kyoto (JP); Takayuki Nishida, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 44 days.

(21) Appl. No.: 16/231,399

(22) Filed: Dec. 22, 2018

(65) Prior Publication Data

US 2019/0252214 A1  Aug. 15, 2019

(30) Foreign Application Priority Data

Feb. 13, 2018  (JP) .............................. JP2018-022893

(51) Int. Cl.
  *H01L 21/67* (2006.01)
  *H01L 21/687* (2006.01)

(52) U.S. Cl.
  CPC .. *H01L 21/67023* (2013.01); *H01L 21/67046* (2013.01); *H01L 21/67051* (2013.01); *H01L 21/68728* (2013.01); *H01L 21/68742* (2013.01); *H01L 21/68792* (2013.01)

(58) Field of Classification Search
  CPC ......... H01L 21/67023; H01L 21/67046; H01L 21/67051; H01L 21/68728; H01L 21/68742; H01L 21/68792
  USPC ...................................................... 134/149
  See application file for complete search history.

(56) References Cited

U.S. PATENT DOCUMENTS

| 9,962,744 B2 | 5/2018 | Kato |
| 2013/0152971 A1 | 6/2013 | Kato |
| 2016/0096205 A1 | 4/2016 | Kato |

FOREIGN PATENT DOCUMENTS

| JP | 2015002328 | 1/2015 |
| JP | 2018148131 | 9/2018 |
| KR | 20160021236 | 2/2016 |

*Primary Examiner* — Tinsae B Ayalew
(74) *Attorney, Agent, or Firm* — JCIPRNET

(57) ABSTRACT

A protective disk is disposed between a spin base and a substrate W and is capable of being raised and lowered between a separated position which is separated downward from the substrate W and a near position which is nearer to the substrate than the separated position. An upper surface of the protective disk has an inner surface which is provided on an inner side of a plurality of holding pins in a radial direction and a flat surface which is provided on an outer side of the inner surface in the radial direction and is provided above the inner surface. The flat surface faces a lower surface of a part on an inner side of an outer circumferential end in the radial direction, in a circumferential edge portion of the substrate.

5 Claims, 7 Drawing Sheets

SUBSTRATE PROCESSING APPARATUS

CROSS-REFERENCE TO RELATED APPLICATION

This application claims the priority of Japan patent application serial no. 2018-022893, filed on Feb. 13, 2018. The entirety of the above-mentioned patent application is hereby incorporated by reference herein and made a part of this specification.

BACKGROUND OF THE DISCLOSURE

Technical Field

A subject disclosed in this specification relates to a substrate processing apparatus. Examples of substrates which are processing targets include substrates such as semiconductor wafers, substrates for liquid crystal display devices, substrates for plasma displays, substrates for field emission displays (FED), substrates for optical discs, substrates for magnetic disks, substrates for magneto-optical discs, substrates for photomasks, ceramic substrates, and substrates for solar cells.

Description of Related Art

A single-wafer processing-type substrate processing apparatus, in which substrates are processed one at a time, includes a spin base that can rotate around a rotation axis extending in a vertical direction and a holding pin that is provided in the spin base and holds a substrate. In substrate processing using such a substrate processing apparatus, an upper surface of a substrate in a rotating state can be processed by a processing liquid discharged from a processing liquid nozzle.

However, during substrate processing, a gas flow is generated around a rotary structure (the spin base or the holding pin), and mist (fine droplets) of a processing liquid generated during substrate processing is carried by the gas flow and goes under a substrate, so that the processing liquid adheres to a lower surface of the substrate sometimes. Therefore, even in a case in which a processing liquid is prevented from flowing along the upper surface and a circumferential edge of a substrate and adhering to the lower surface of the substrate, there is concern that the processing liquid will adhere to the lower surface of the substrate.

In a substrate processing apparatus disclosed in Patent Document 1 (Japanese Laid-Open No. 2015-2328), substrate processing in which a protective disk is provided between a lower surface of a substrate and a spin base so that an upper surface of the substrate is processed while the lower surface of the substrate is protected is proposed. In more detail, the protective disk is lifted from the spin base to approach the lower surface of the substrate, so that mist of a processing liquid is prevented from entering a space between the protective disk and the lower surface of the substrate.

However, in the case of the technology described above, even if the protective disk approaches the lower surface of a substrate, a gap is formed between the protective disk and the lower surface in the circumferential edge portion of the substrate. Therefore, there is concern that the lower surface of a substrate will be contaminated due to mist of a processing liquid passing through this gap.

SUMMARY OF THE DISCLOSURE

The disclosure provides a technology of reducing contamination on a lower surface of a substrate.

According to an embodiment of the disclosure, there is provided a substrate processing apparatus for processing a substrate including a spin base that rotates around a rotation axis extending in a vertical direction, a plurality of holding portions that are provided in the spin base with intervals therebetween in a rotation direction of the spin base and hold a circumferential edge portion of the substrate above the spin base, a facing member that is disposed between the spin base and the substrate and is capable of being raised and lowered between a separated position which is separated downward from the substrate and a near position which is nearer to the substrate than the separated position, and a gas supply portion that supplies a gas to a space between the facing member and the substrate which is held by the plurality of holding portions. An upper surface of the facing member includes a flat surface which faces a lower surface of a part on an inner side of an outer circumferential end in a radial direction, in the circumferential edge portion of the substrate, and an inner surface which is provided on an inner side of the flat surface in the radial direction and is provided below the flat surface.

These and other objects, features, aspects and advantages of the disclosure will become more apparent from the following detailed description of the disclosure when taken in conjunction with the accompanying drawings.

DESCRIPTION OF THE EMBODIMENTS

Figure 1:
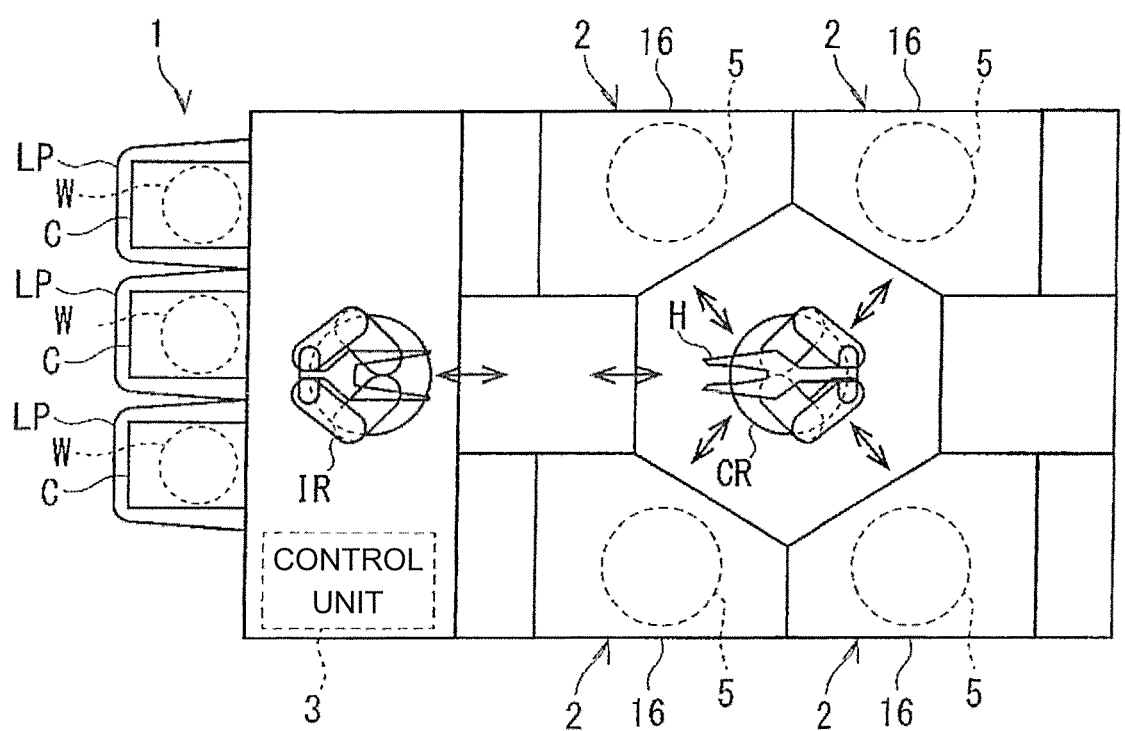
FIG. 1 is a plan view illustrating a configuration of a substrate processing apparatus 1 of a first embodiment.

Hereinafter, an embodiment of the disclosure will be described with reference to the accompanying drawings. Constituent elements disclosed in this embodiment are merely examples and the scope of the disclosure is not intended to be limited to only the examples. In the drawings, for easy understanding, there are cases in which the dimensions or the numbers of portions are illustrated in an exaggerated or simplified manner, as necessary.

As used throughout this disclosure, the singular forms "a," "an," and "the" include plural reference unless the context clearly dictates otherwise. Thus, for example, a reference to "a composition" includes a plurality of such compositions, as well as a single composition.

1. First Embodiment

FIG. 1 is a plan view illustrating a configuration of a substrate processing apparatus 1 of a first embodiment. The substrate processing apparatus 1 is a single-wafer processing-type apparatus in which substrates W such as silicon wafers are processed one at a time. In this embodiment, the substrate W is a disk-shaped substrate. The substrate processing apparatus 1 includes a plurality of processing units 2 for processing the substrate W with a processing liquid such as a chemical liquid or a rinse liquid, a load port LP in which a carrier C accommodating a plurality of substrates W to be processed by the processing units 2 is mounted, conveyance robots IR and CR which convey the substrate W between the load port LP and the processing units 2, and a control unit 3 which controls the substrate processing apparatus 1. The conveyance robot IR conveys the substrate W between the carrier C and the conveyance robot CR. The conveyance robot CR conveys the substrate W between the conveyance robot IR and the processing unit 2. For example, the plurality of processing units 2 have similar configurations to each other.

Figure 2:
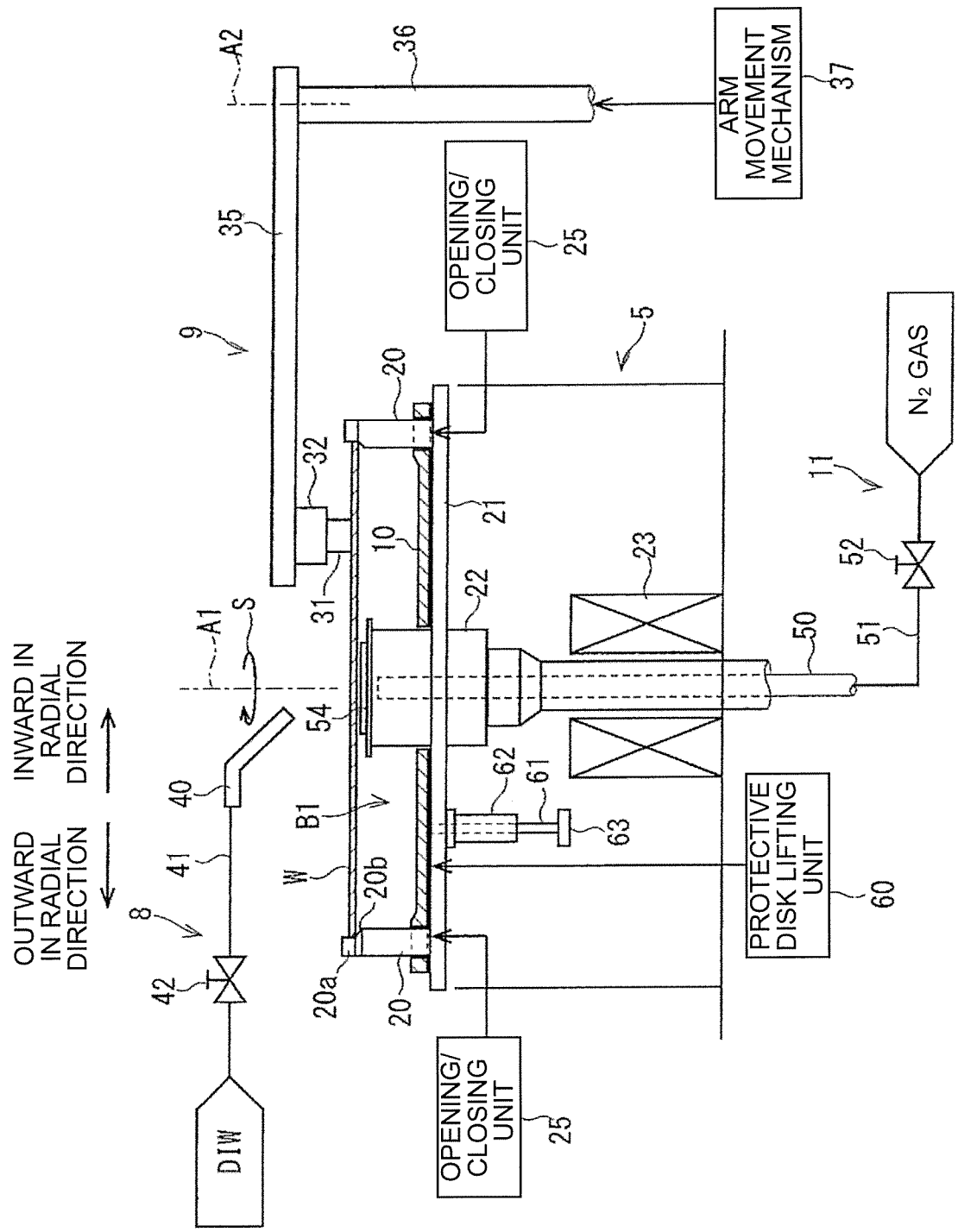
FIG. 2 is a schematic view for describing an example of a configuration of a processing unit 2 of the first embodiment.

FIG. 2 is a schematic view for describing an example of a configuration of the processing unit 2 of the first embodiment. The processing unit 2 further includes a spin chuck 5 which rotates the substrate W around a vertical rotation axis A1 passing through a middle portion of the substrate W, while holding one substrate W in a horizontal posture; a processing liquid supply unit 8 which supplies a processing liquid such as deionized water (DIW) to an upper surface of the substrate W; a washing unit 9 which washes the upper surface of the substrate W by scrubbing the upper surface of the substrate W with a brush 31; and a protective disk 10 which faces the substrate W from below and protects a lower surface of the substrate W from mist of the processing liquid generated during substrate processing. The protective disk 10 is an example of a facing member which faces at least a circumferential edge portion WEP1 of the substrate W from below. The processing unit 2 further includes a gas supply unit 11 which supplies a gas such as a nitrogen ($N_2$) gas to a space B1 between the lower surface of the substrate W and the protective disk 10.

In this disclosure, a direction orthogonal to the rotation axis A1 will be referred to as a "radial direction". In addition, a direction toward the rotation axis A1 in the radial direction will be referred to as "inward (inner side) in the radial direction", and a direction toward a side opposite to the rotation axis A1 side in the radial direction will be referred to as "outward (outer side) in the radial direction".

The processing unit 2 further includes a chamber 16 which accommodates the spin chuck 5 (refer to FIG. 1). A gateway (not illustrated), through which the substrate W is carried into the chamber 16 and the substrate W is carried out from the inside of the chamber 16, is formed in the chamber 16. The chamber 16 includes a shutter unit (not illustrated) for opening and closing this gateway.

The spin chuck 5 includes a spin base 21, a plurality of holding pins 20 which hold the circumferential edge portion WEP1 of the substrate W above the spin base 21, a rotary shaft 22 which is joined to a middle part of the spin base 21, and an electric motor 23 which applies a rotation force to the rotary shaft 22. The rotary shaft 22 extends in a vertical direction along the rotation axis A1. The rotary shaft 22 penetrates the spin base 21 and has an upper end above the spin base 21. The spin base 21 has a disk shape in a horizontal direction. The plurality of holding pins 20 are provided in the circumferential edge portion WEP1 on the upper surface of the spin base 21 with intervals therebetween in a rotation direction S.

Opening/closing units 25 for driving opening/closing of the plurality of holding pins 20 are provided. The plurality of holding pins 20 hold the substrate W when closed by the opening/closing units 25. The plurality of holding pins 20 release a hold on the substrate W when opened by the opening/closing units 25.

For example, the opening/closing unit 25 includes a link mechanism (not illustrated) and a drive source (not illustrated). For example, the drive source includes a ball screw mechanism and an electric motor which applies a driving force thereto. The opening/closing unit 25 may be configured to open and close the plurality of holding pins 20 by using a magnetic force. In this case, for example, the opening/closing unit 25 includes a first magnet (not illustrated) which is attached to the holding pin 20, and a second magnet (not illustrated) which comes near the first magnet to apply a repulsive force or a suction force to the first magnet. The holding pin 20 switches between opening and closing due to a repulsive force or a suction force applied to the first magnet by the second magnet.

The electric motor 23 rotates the spin base 21 by rotating the rotary shaft 22. In response to this rotation of the spin base 21, the substrate W rotates around the rotation axis A1. The spin chuck 5 is included in a substrate holding rotation unit which holds the substrate W and rotates the substrate W around the rotation axis A1 extending in the vertical direction. The processing liquid supply unit 8 includes a processing liquid nozzle 40 which supplies a processing liquid such as DIW to the upper surface of the substrate W, a processing liquid supply pipe 41 which is joined to the processing liquid nozzle 40, and a processing liquid valve 42 which is installed in the processing liquid supply pipe 41. A processing liquid is supplied to the processing liquid supply pipe 41 from a processing liquid supply source.

The processing liquid nozzle 40 may be a fixed nozzle which is fixed at a certain position or may be a movable nozzle which can move in the horizontal direction and the vertical direction. In addition, a processing liquid supplied from the processing liquid nozzle 40 is not limited to DIW. Carbonated water, electrolytic ionic water, ozone water, hydrochloric acid water with a dilution concentration (for example, approximately 10 ppm to 100 ppm), and regenerated water (hydrogen water) may be adopted.

The washing unit 9 includes the brush 31 for washing the upper surface of the substrate W, a brush arm 35 which supports the brush 31, a pivoting shaft 36 on which the brush arm 35 pivots, and an arm movement mechanism 37 which moves the brush arm 35 in the horizontal direction and the vertical direction by driving the pivoting shaft 36. The brush 31 is held by a brush holder 32 disposed above the brush 31. The brush holder 32 protrudes downward from the brush arm 35.

For example, the brush 31 is an elastically deformable sponge brush made of a synthetic resin such as polyvinyl alcohol (PVA). The brush 31 protrudes downward from the brush holder 32. The brush 31 is not limited to a sponge brush and may be a brush including a bundle of fibers formed of a plurality of resin fibers.

The arm movement mechanism 37 includes a brush horizontal-movement mechanism (not illustrated) which horizontally moves the brush arm 35 by causing the pivoting shaft 36 to pivot around a pivoting axis A2, and a brush vertical-movement mechanism (not illustrated) which vertically moves the brush arm 35 by vertically moving the pivoting shaft 36. For example, the brush horizontal-movement mechanism includes an electric motor for pivoting the pivoting shaft 36. For example, the brush vertical-movement mechanism includes a ball screw mechanism and an electric motor for driving the ball screw mechanism.

The gas supply unit 11 includes a gas nozzle 50 which supplies a gas such as a nitrogen gas to the space B1 between the lower surface of the substrate W and the upper surface of the protective disk 10, a gas supply pipe 51 which is joined to the gas nozzle 50, and a gas valve 52 which is installed in the gas supply pipe 51 and opens and closes a flow channel of a gas. A gas such as a nitrogen gas is supplied to the gas supply pipe 51 from a gas supply source.

As a gas to be supplied from the gas supply source to the gas supply pipe 51, it is preferable to use an inert gas such as a nitrogen gas. An inert gas is not limited to a nitrogen gas, and it indicates an inactive gas with respect to the upper surface and the pattern of the substrate W. Examples of inert gases include rare gases such as helium and argon, forming gases (mixed gases of a nitrogen gas and a hydrogen gas), in addition to a nitrogen gas. In addition, air can be utilized as a gas to be supplied form the gas supply source to the gas supply pipe 51.

The gas nozzle 50 is inserted through the rotary shaft 22. The upper end of the gas nozzle 50 is exposed from the upper end of the rotary shaft 22. A straightening member 54 which straightens a gas discharged from the gas nozzle 50 may be provided above the upper end of the gas nozzle 50. The protective disk 10 has a substantially toric shape. The rotary shaft 22 is inserted through an insertion hole 10H which is formed at the center of the protective disk 10. The protective disk 10 is disposed between the substrate W held by the holding pins 20, and the spin base 21. The protective disk 10 can move upward and downward with respect to the rotary shaft 22.

The protective disk 10 is coupled to a protective disk lifting unit 60 which raises and lowers the protective disk 10. The protective disk 10 can be moved, by the protective disk lifting unit 60, between a separated position which is separated downward from the substrate W, and a near position which is nearer to the lower surface of the substrate W held by the holding pins 20 above the separated position. The protective disk lifting unit 60 is an example of a facing member lifting unit which raises and lowers the facing member.

For example, the protective disk lifting unit 60 includes a ball screw mechanism (not illustrated) and an electric motor (not illustrated) which applies a driving force to the ball screw mechanism. In addition, the protective disk lifting unit 60 may be configured to raise and lower the protective disk 10 by a magnetic force. In this case, for example, the protective disk lifting unit 60 is configured to have a first magnet (not illustrated) which is attached to the protective disk 10, and a second magnet (not illustrated) which raises the protective disk 10 together with the first magnet by applying a repulsive force to the first magnet.

Guide shafts 61 extending in the vertical direction parallel to the rotation axis A1 are joined to the lower surface of the protective disk 10. The guide shafts 61 are disposed in a plurality of places at equal intervals in the rotation direction S of the substrate W. The guide shafts 61 are joined to linear bearings 62 which are provided in corresponding places in the spin base 21. The guide shaft 61 can move in a direction parallel to the vertical direction, that is, the rotation axis A1 while being guided by this linear bearing 62. In addition, since the guide shafts 61 joined to the lower surface of the protective disk 10 are joined to the linear bearings 62, the protective disk 10 integrally rotates with the spin base 21 around the rotation axis A1.

The guide shaft 61 penetrates the linear bearing 62. The guide shaft 61 includes a flange 63 which protrudes laterally in a lower end of the guide shaft 61. When the flange 63 abuts the lower end of the linear bearing 62, upward movement of the guide shaft 61, that is, upward movement of the protective disk 10 is restricted. That is, the flange 63 is a restriction member which restricts upward movement of the protective disk 10.

The holding pin 20 includes a clamping portion 20a and a support portion 20b. The clamping portion 20a is a part which abuts a circumferential end of the substrate W from the horizontal direction and clamps the substrate W between itself and another clamping portion 20a. The support portion 20b is a part which supports the substrate W from below. In this example, the upper surface of the support portion 20b is formed to be an inclined surface which is inclined downward to the rotation axis A1 side (inward in the radial direction). Here, the inclined surface is inclined at a uniform inclination.

Figure 3:
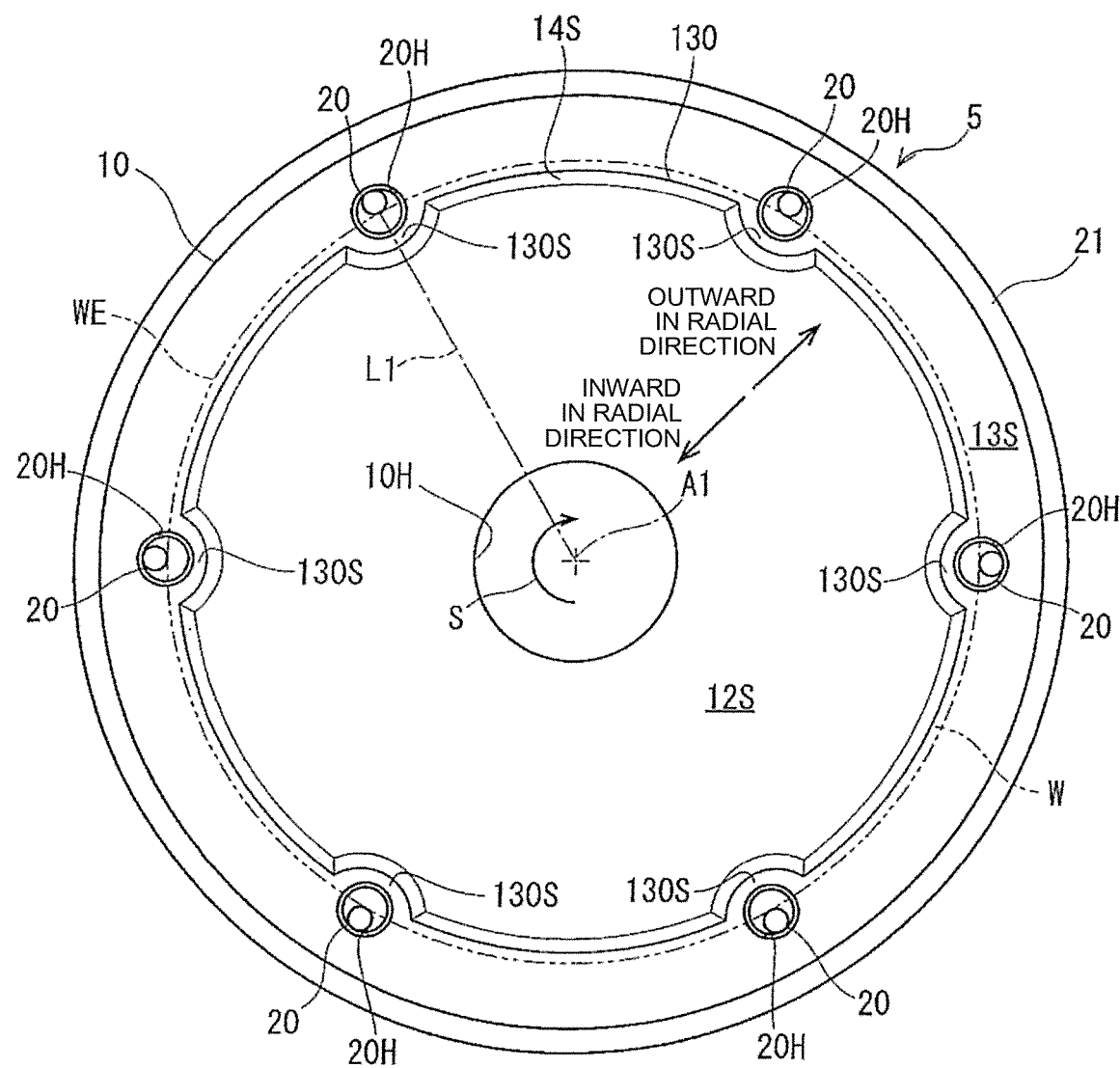
FIG. 3 is a plan view of a spin base 21 of the first embodiment seen from above.
Figure 4:
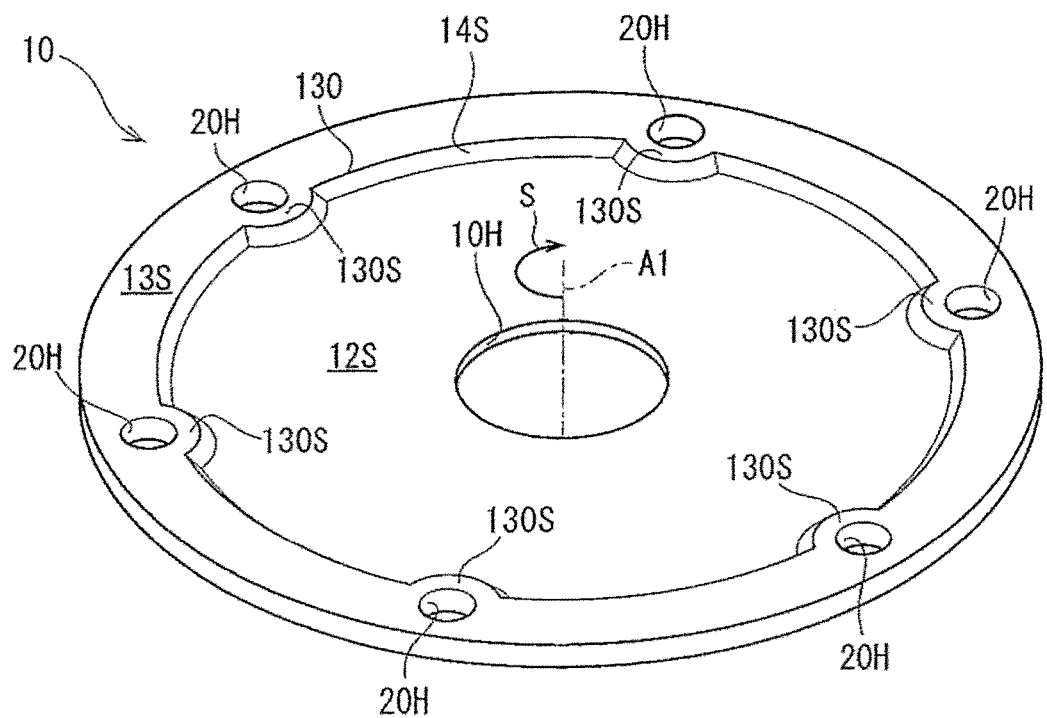
FIG. 4 is a schematic plan view of a protective disk 10 seen from above.
Figure 5:
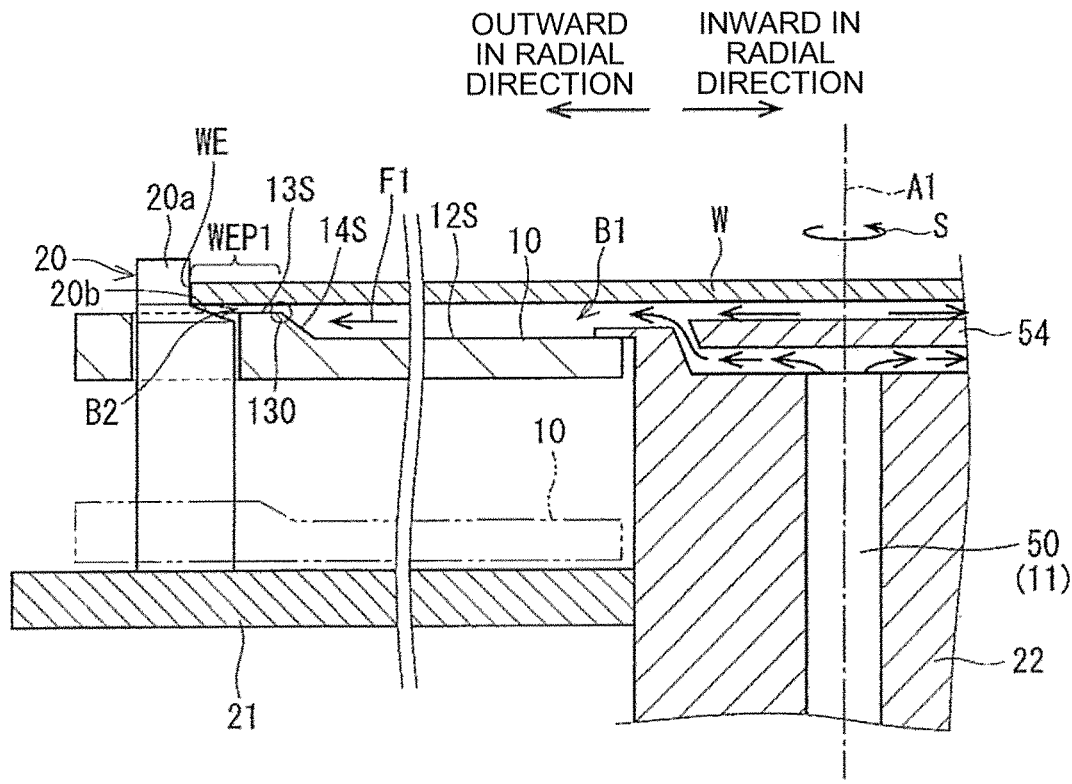
FIG. 5 is a schematic side view illustrating the surroundings of a holding pin 20.

FIG. 3 is a plan view of the spin base 21 of the first embodiment seen from above. FIG. 4 is a schematic plan view of the protective disk 10 seen from above. FIG. 5 is a schematic side view illustrating the surroundings of the holding pin 20. In FIG. 3, for convenience of description, the substrate W is illustrated with a two-dot chain line. As illustrated in FIGS. 3 to 5, the protective disk 10 includes a plurality of pin insertion holes 20H. The plurality of pin insertion holes 20H are provided in the horizontal direction at positions respectively corresponding to the plurality of holding pins 20 (that is, overlapping positions in the vertical direction). Then, one holding pin 20 located in a corresponding position is inserted through each of the plurality of pin insertion holes 20H.

The upper surface of the protective disk 10 has an inner surface 12S and a flat surface 13S. The inner surface 12S is a surface provided on the inner side of the holding pin 20 in the radial direction. In this example, the inner surface 12S is a flat surface parallel to a horizontal plane. However, it is not essential for the inner surface 12S to be a flat surface.

The flat surface 13S is provided on the outer side of the inner surface 12S in the radial direction. In this example, the flat surface 13S is provided to have a ring shape surrounding the outer circumference of the inner surface 12S and occupies the circumferential edge portion WEP1 on the upper surface of the protective disk 10 (a part on the inner side in the radial direction by a predetermined length from an outer circumferential end of the protective disk 10). In this example, the flat surface 13S is parallel to a horizontal plane and is located to be substantially parallel to the lower surface of the substrate W horizontally held by the plurality of holding pins 20. The inner surface 12S is located to be lower than the flat surface 13S. On the upper surface of the facing member 10, a part to be higher than the flat surface 13S is not inhibited from being provided on the inner side of the flat surface 13S.

The flat surface 13S faces the circumferential edge portion WEP1 of the substrate W (an outer circumferential end WE of the substrate W and a part on a slightly inner side from the outer circumferential end WE). It is preferable that the flat surface 13S face the circumferential edge portion WEP1 from the outer circumferential end WE of the substrate W to a part on an inner side by 3 mm or more.

In the protective disk 10, there is concern that when a region approaching the substrate W increases, the protective disk 10 will come into contact with the substrate W. Therefore, it is favorable that the flat surface 13S be provided to face the circumferential edge portion WEP1 from the outer circumferential end WE of the substrate W to the extent of 10 mm, for example.

The upper surface of the protective disk 10 further includes an inclined surface 14S. The inclined surface 14S is provided between the inner surface 12S and the flat surface 13S and is formed to have a toric shape, in this example. In addition, the inclined surface 14S is inclined upward at a uniform inclination from the inner surface 12S to the outer side in the radial direction.

As illustrated in FIG. 5, in this example, an outer end of the inclined surface 14S (an end portion on the outer side in the radial direction) is directly connected to an inner end of the flat surface 13S (an end portion on the inner side in the radial direction). In a state in which the substrate W is held by the holding pins 20, a boundary part 130 (the inner end of the flat surface 13S) between the flat surface 13S and the inclined surface 14S is located on the inner side of the outer circumferential end WE of the substrate W held by the holding pins 20, in the radial direction.

When the protective disk 10 moves to the near position, the circumferential edge portion WEP1 of the substrate W faces the flat surface 13S of the protective disk 10, so that a straightening space B2 is formed therebetween. A gas supplied from the gas nozzle 50 moves outward in the radial direction. However, the gas passes through the straightening space B2, so that the flow (gas flow F1) of the gas is straightened. Then, the gas escapes outward in the radial direction from the outer circumferential end WE of the substrate W in a straightened state. Accordingly, in the vicinity of the outer circumferential end WE of the substrate W, a processing liquid or the like can be inhibited from entering the straightening space B2 from outside.

In addition, since a connection part between the inner surface 12S and the flat surface 13S on the upper surface of the protective disk 10 is formed to be the smoothly inclined surface 14S, it is possible to reduce a disturbance in the gas flow F1 directed outward in the radial direction in the space B1 before entering the straightening space B2.

Figure 6:
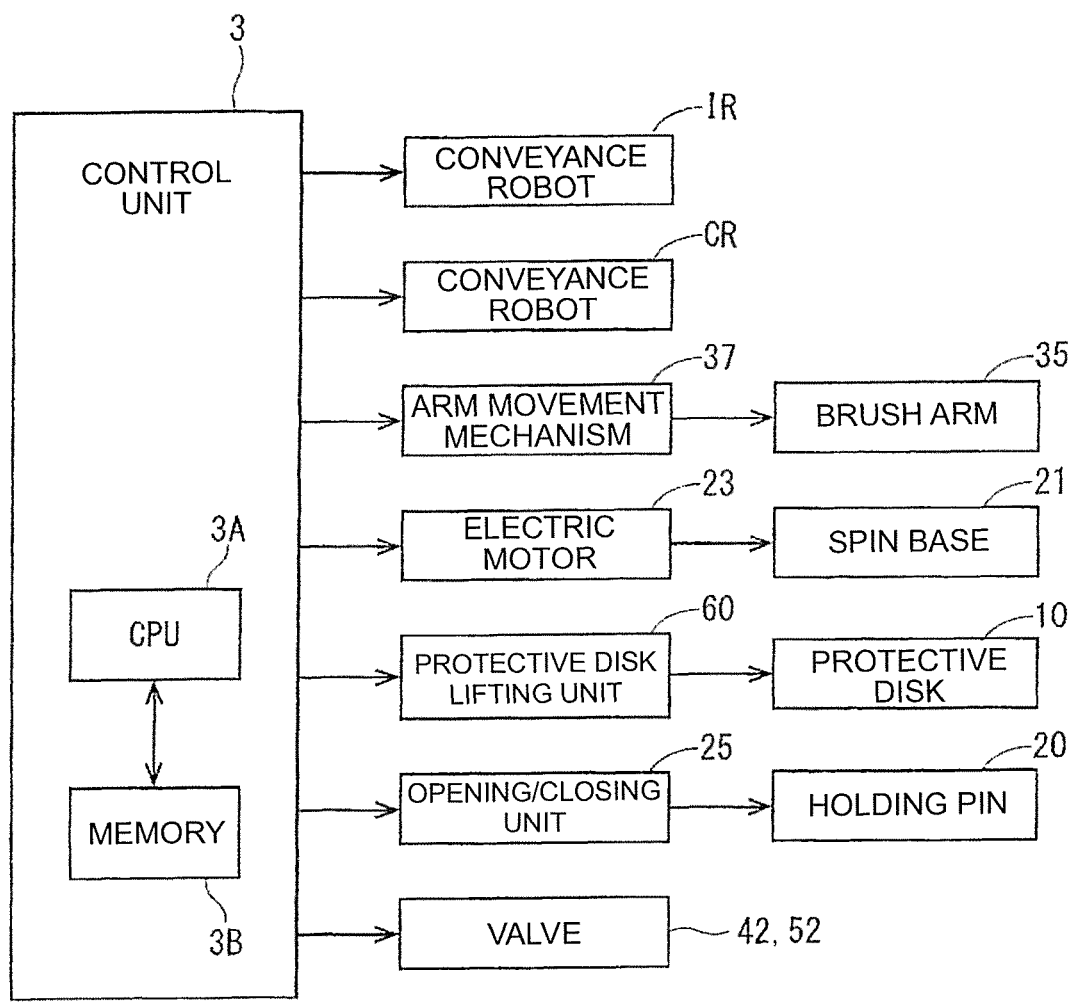
FIG. 6 is a block diagram for describing an electric configuration of the substrate processing apparatus 1 of the first embodiment.

FIG. 6 is a block diagram for describing an electric configuration of the substrate processing apparatus 1 of the first embodiment. The control unit 3 includes a microcomputer and controls a control target provided in the substrate processing apparatus 1 in accordance with a predetermined program. More specifically, the control unit 3 includes a processor (CPU) 3A and a memory 3B in which a program is stored. The processor 3A is configured to execute a program to conduct various kinds of control for substrate processing. For example, the control unit 3 controls operations of the conveyance robots IR and CR, the arm movement mechanism 37, the electric motor 23, the protective disk lifting unit 60, the opening/closing units 25, the valves 42 and 52, and the like.

<Operation of Substrate Processing Apparatus 1>

Figure 7:
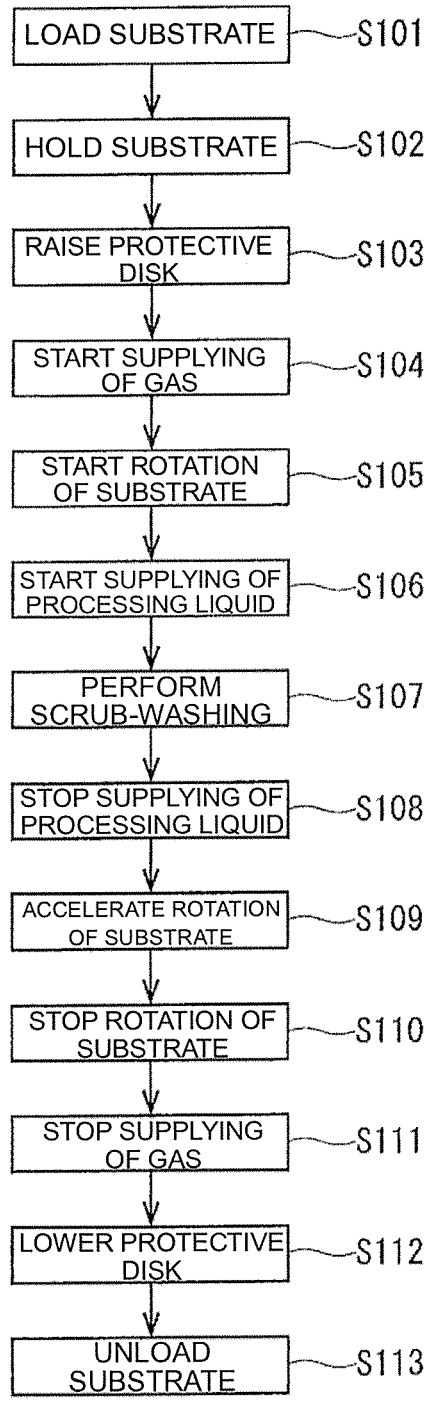
FIG. 7 is a flowchart for describing an example of substrate processing performed by the substrate processing apparatus 1 of the first embodiment.

FIG. 7 is a flowchart for describing an example of substrate processing performed by the substrate processing apparatus 1 of the first embodiment. Unless otherwise specified, each step of the processing described below is realized when the control unit 3 executes a program.

First, the control unit 3 performs substrate loading processing (Step S101). Specifically, an unprocessed substrate W is loaded from the carrier C to the processing units 2 by the conveyance robots IR and CR and is passed over to the spin chuck 5. The substrate W is held in a substantially horizontal manner with a gap formed upward from the upper surface of the spin base 21 until it is carried out by the conveyance robot CR.

After the substrate loading processing, the control unit 3 performs substrate holding processing (Step S102). Specifically, the opening/closing units 25 cause the plurality of holding pins 20 to hold the circumferential edge of the substrate W. In this case, the plurality of holding pins 20 hold the substrate W in a state of causing a device surface of the substrate W on which a device is formed to face downward.

After the substrate holding processing, the control unit 3 performs protective disk raising processing (Step S103). Specifically, the protective disk lifting unit 60 raises the protective disk 10 to the near position. Accordingly, as illustrated in FIG. 5, the straightening space B2 is formed between the circumferential edge portion WEP1 of the substrate W and the flat surface 13S of the protective disk 10.

After the protective disk raising processing, the control unit 3 performs gas supply start processing (Step S104). Specifically, when the gas valve 52 is opened, a gas (a nitrogen gas or the like) starts to be supplied to the space B1 between the upper surface of the protective disk 10 and the lower surface of the substrate W. In this case, the supply flow rate of the gas is within a range of 100 to 200 liter/minute (L/min), for example. The gas is supplied until gas supply stop processing (Step S111), which will be described below, is performed.

After the gas supply start processing, the control unit 3 performs substrate rotation start processing (Step S105). Specifically, the electric motor 23 rotates the spin base 21, so that the substrate W horizontally held by the holding pins 20 rotates around the rotation axis A1. In this case, the rotation speed of the substrate W is within a range of 100 rpm to 1,000 rpm, for example.

After the substrate rotation start processing, the control unit 3 performs processing liquid supply start processing (Step S106). Specifically, in a state in which a gas is being continuously supplied to the space B1 between the upper surface of the protective disk 10 and the lower surface of the substrate W, the processing liquid valve 42 is opened. Accordingly, a processing liquid (DIW or the like) starts to be supplied to the upper surface of the substrate W.

After the processing liquid supply start processing, the control unit 3 performs scrub-washing processing (Step S107). Specifically, the arm movement mechanism 37 moves the brush arm 35, so that the brush arm 35 is pressed to the upper surface of the substrate W. Since the substrate W is being rotated through the substrate rotation start processing (Step S105), the brush 31 scrubs the upper surface of the substrate W. After a predetermined time elapses from when the brush 31 has abutted the substrate W, the arm movement mechanism 37 causes the brush 31 to laterally retreat from above the spin chuck 5.

After the scrub-washing processing, the control unit 3 performs processing liquid supply stop processing (Step S108). Specifically, the processing liquid valve 42 is closed, so that a processing liquid stops being supplied from the processing liquid nozzle 40.

After the processing liquid supply stop processing, the control unit 3 performs substrate high-speed rotation processing (Step S109). Specifically, the electric motor 23 accelerates rotation of the spin base 21, so that the rotation speed of the substrate W increases. Accordingly, droplets on the upper surface and a circumferential end surface (an end surface of the outer circumferential end WE) of the substrate W are shaken off due to a centrifugal force. Consequently, the substrate W is dried. That is, the substrate high-speed rotation processing corresponds to spin-dry processing. The rotation speed of the substrate W during this spin-dry processing is within a range of 1,500 to 3,000 rpm, for example.

After a predetermined time elapses from when high-speed rotation has started, the control unit 3 performs substrate rotation stop processing (Step S110). Specifically, the electric motor 23 stops rotation of the spin base 21, so that rotation of the substrate W stops.

After the substrate rotation stop processing, the control unit 3 performs the gas supply stop processing (Step S111). Specifically, the gas valve 52 is closed, so that a gas (a nitrogen gas or the like) stops being supplied to the space B1 between the lower surface of the substrate W and the upper surface of the protective disk 10.

After the gas supply stop processing, the control unit 3 performs protective disk lowering processing (Step S112). Specifically, the protective disk lifting unit 60 lowers the protective disk 10 to the separated position.

After the protective disk lowering processing, the control unit 3 performs substrate hold cancellation processing (Step S113). Specifically, each of the opening/closing units 25 causes each of the plurality of holding pins 20 to be in an open state, so that the substrate W is released from a state of being held by the plurality of holding pins 20.

After the substrate hold cancellation processing, the control unit 3 performs substrate unloading processing. Specifically, the conveyance robot CR enters the processing units 2, picks up a processed substrate W from the spin chuck 5, and unload the processed substrate W from the processing units 2. This substrate W is passed over from the conveyance robot CR to the conveyance robot IR and is stored in the carrier C by the conveyance robot IR.

<Regarding Gas Flow in Vicinity of Circumferential Edge Portion of Substrate>

In is ascertained that gas flows are generated around a rotary structure. Specifically, when the substrate W, the protective disk 10, and the spin base 21 rotate, an atmospheric gas may enter the space B1 between the lower surface of the substrate W and the upper surface of the protective disk 10 from the outer side in the radial direction. In addition, an atmospheric gas may flow into the space B1 from the outer side in the radial direction through a space between the holding pins 20 and the protective disk 10. In this manner, there is concern that when a gas flow from the outer side in the radial direction to the space B1 is generated, a processing liquid which has been shaken off from the upper surface of the substrate W and has arrived at the end surface of the substrate W will enter the space B1 together with the gas flow and will contaminate the lower surface of the substrate W.

Therefore, in the substrate processing apparatus 1, a gas is supplied to a space between the lower surface of the substrate W and the upper surface of the protective disk 10, so that the gas flow F1 directed outward in the radial direction is generated in the vicinity of the circumferential edge portion WEP1 of the substrate W (refer to FIG. 5). Accordingly, an atmospheric gas is prevented from entering the space B1 from the outer side in the radial direction. In the present embodiment, on the upper surface of the protective disk 10, the flat surface 13S provided above the inner surface 12S faces the circumferential edge portion WEP1 of the substrate W. Therefore, a gap between the circumferential edge portion WEP1 of the substrate W and the protective disk 10 is smaller than a part on the inner side of the substrate W facing the inner surface 12S. Consequently, the linear velocity of the gas flow F1 escaping outward in the radial direction from the circumferential edge portion WEP1 of the substrate W can be increased. Thus, a processing liquid can be prevented from entering the lower surface side of the substrate W from the outer side in the radial direction.

There is concern that when a disturbance is generated in the gas flow F1, an atmospheric gas and a processing liquid from the outer side in the radial direction will not be prevented. Therefore, it is desirable that the gas flow F1 directed outward in the radial direction be straightened in the circumferential edge portion WEP1 of the substrate W. In contrast, in the present embodiment, since the circumferential edge portion WEP1 of the substrate W faces the flat surface 13S of the protective disk 10, the straightening space B2 is formed. The straightening space B2 is a space interposed between the flat lower surface of the substrate W and the flat surface 13S of the protective disk 10. Therefore, the gas flow F1 directed outward in the radial direction can be straightened in the straightening space B2.

Particularly, the flat surface 13S of the protective disk 10 is substantially parallel to the flat lower surface of the substrate W. Therefore, the height range of the straightening space B2 is substantially uniform in the radial direction. Consequently, the gas flow F1 directed outward in the radial direction can be effectively straightened.

In addition, the flat surface 13S of the protective disk 10 extends outward in the radial direction from a position on the inner side of the pin insertion hole 20H in the radial direction. Therefore, the gas flow F1 can be straightened on the inner side of the holding pin 20 in the radial direction.

In addition, the flat surface 13S further extends outward in the radial direction beyond the outer circumferential end WE of the substrate W. In this case, since the flat surface 13S faces a range to the extent of the outer circumferential end WE of the substrate W, the gas flow F1 can be straightened to a region extremely close to the outer circumferential end WE. That is, it is possible to reduce a disturbance in the gas flow F1 in the vicinity of the outer circumferential end WE.

Figure 8:
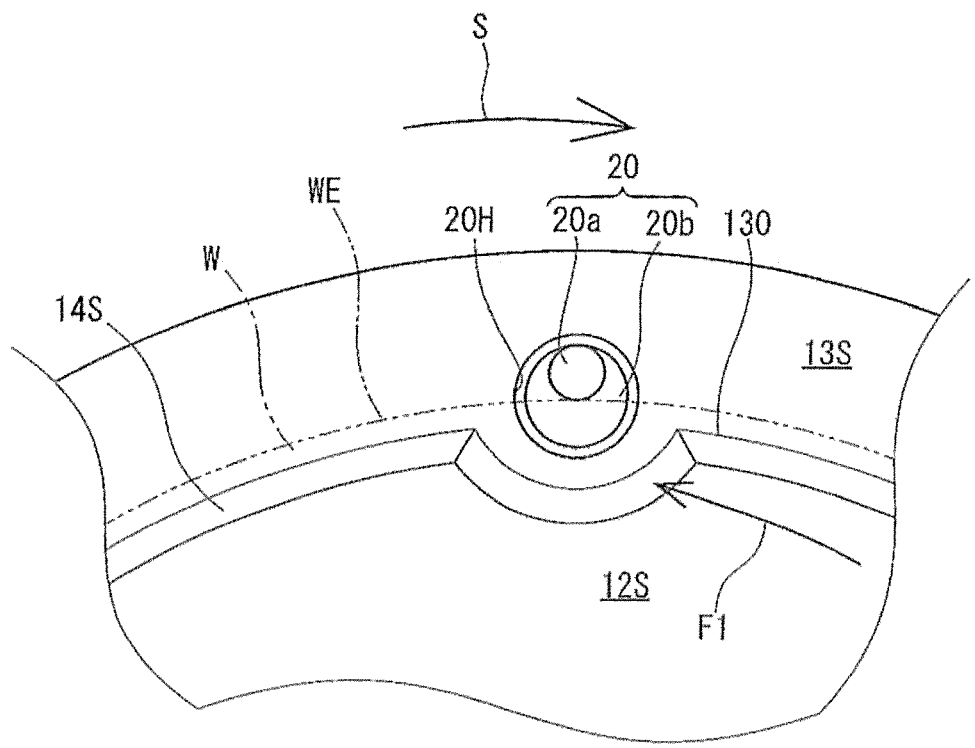
FIG. 8 is a schematic plan view illustrating the surroundings of the holding pin 20.

FIG. 8 is a schematic plan view illustrating the surroundings of the holding pin 20. As illustrated in FIG. 8, on the flat surface 13S of the protective disk 10 in this example, a part 130S positioned on the inner side in the radial direction with respect to the holding pin 20 (on the flat surface 13S, a part positioned on a straight line L1 connecting the center (the center of gravity) of the holding pin 20 and the rotation axis A1 to each other in a plan view (refer to FIG. 3)) protrudes inward in the radial direction beyond other parts in the rotation direction S. In this example, on the flat surface 13S, the part 130S positioned on the inner side in the radial direction with respect to the pin insertion hole 20H through which the holding pin 20 is inserted protrudes inward in the radial direction beyond other parts in the rotation direction S. Accordingly, even at a position on the inner side in the radial direction with respect to the holding pin 20, the flat surface 13S can face the lower surface of the substrate W. Therefore, even in a region on the inner side in the radial direction with respect to the holding pin 20, the gas flow F1 directed outward in the radial direction can be straightened.

2. Modification Example

Hereinabove, the embodiment has been described. However, the present disclosure is not limited to those described above, and various modifications can be performed.

Figure 9:
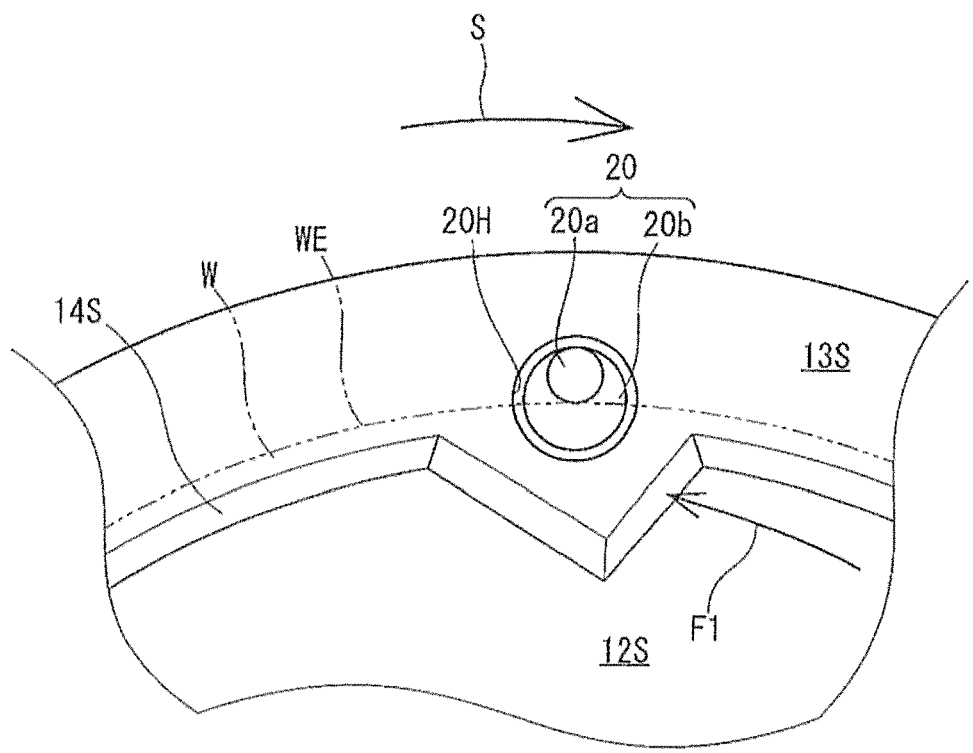
FIG. 9 is a schematic plan view illustrating the surroundings of the holding pin 20 according to a modification example.

FIG. 9 is a schematic plan view illustrating the surroundings of the holding pin 20 according to a modification example. In the example illustrated in FIG. 8, at a position on the inner side in the radial direction with respect to the pin insertion hole 20H, the flat surface 13S protrudes in a curved line shape which is projected inward in the radial direction. In contrast, in the example illustrated in FIG. 9, the flat surface 13S protrudes in an angulated line shape which is projected inward in the radial direction. In this case as well, the flat surface 13S can face the lower surface of the substrate W on the inner side of the holding pin 20 in the radial direction. Therefore, the gas flow F1 directed outward in the radial direction can be straightened on the inner side of the holding pin 20 in the radial direction.

For example, in the first embodiment, the pin insertion hole 20H is formed to have a toric penetration hole shape. However, it may be formed to have a notch shape recessed inward from the outer circumferential end of the protective disk 10.

It is not essential for [ ] the protective disk 10 to have the flat surface 13S which faces the entire circumferential edge portion WEP1 of the substrate W in the circumferential direction (the rotation direction S). For example, the protective disk 10 may include a flat surface which faces a part on the inner side of the outer circumferential end WE excluding the outer circumferential end WE in the circumferential edge portion WEP1 of the substrate W.

On the upper surface of the protective disk 10, a connection part between the inner surface 12S and the flat surface 13S is formed to be the inclined surface 14S having a uniform inclination. However, the connection part does not have to have a uniform inclination. In addition, the inclined surface 14S is formed to have an inclined shape in which the height continuously changes. However, it may be formed to have a step shape in which the height discontinuously changes.

It is not essential for the protective disk 10 to have the flat surface 13S which faces the entire circumferential edge portion WEP1. For example, the protective disk 10 may have a flat surface which faces a part on the inner side excluding the outer circumferential end WE in the circumferential edge portion WEP1 of the substrate W.

According to an embodiment of the disclosure, there is provided a substrate processing apparatus for processing a substrate including a spin base that rotates around a rotation axis extending in a vertical direction, a plurality of holding portions that are provided in the spin base with intervals therebetween in a rotation direction of the spin base and hold a circumferential edge portion of the substrate above the spin base, a facing member that is disposed between the spin base and the substrate and is capable of being raised and lowered between a separated position which is separated downward from the substrate and a near position which is nearer to the substrate than the separated position, and a gas supply portion that supplies a gas to a space between the facing member and the substrate which is held by the plurality of holding portions. An upper surface of the facing member includes a flat surface which faces a lower surface of a part on an inner side of an outer circumferential end in a radial direction, in the circumferential edge portion of the substrate, and an inner surface which is provided on an inner side of the flat surface in the radial direction and is provided below the flat surface.

In the substrate processing apparatus according to the embodiment, the flat surface of the facing member facing the circumferential edge portion of the substrate is located above the inner surface. Therefore, it is possible to reduce a gap between the circumferential edge portion of a substrate and the facing member. Therefore, it is possible to increase the linear velocity of a gas flow directed outward in the radial direction through this gap. In addition, since a part facing the circumferential edge portion of the substrate is a flat surface, a gas flow directed outward in the radial direction can be straightened between the circumferential edge portion of the substrate and the flat surface of the facing member. Therefore, since a gas flow in the circumferential edge portion of the substrate can be straightened, a foreign substance can be prevented from entering the lower surface side of a substrate.

Preferably, the upper surface of the facing member includes an inclined surface which is inclined upward to an outer side in the radial direction between the inner surface and the flat surface.

According to the embodiment, it is possible to reduce a disturbance in a gas flow between a substrate and the facing member, which is caused due to the difference between the heights thereof and is directed toward the flat surface from the inner surface.

Preferably, the flat surface of the facing member extends outward in the radial direction from a position on an inner side of the plurality of holding portions in the radial direction.

According to the embodiment, it is possible to reduce occurrence of a disturbance in a gas flow in the vicinity of the holding portion.

Preferably, the facing member includes an insertion hole through which the holding portion is inserted, and the flat surface of the facing member extends outward in the radial direction from a predetermined position on an inner side of the insertion hole in the radial direction.

According to the embodiment, since the flat surface of the facing member faces a substrate from a part on the inner side of the holding portion in the radial direction, it is possible to effectively reduce occurrence of a disturbance in a gas flow directed outward in the radial direction.

Preferably, the flat surface extends outward in the radial direction beyond the substrate.

According to the embodiment, since the flat surface extends outward in the radial direction beyond the substrate, it is possible to reduce occurrence of a disturbance in a gas flow in the vicinity of the outer circumferential end of the substrate.

Preferably, the substrate processing apparatus further includes a processing liquid supply portion that supplies a processing liquid to the upper surface of the substrate held by the plurality of holding portions.

According to the embodiment, since a gas is supplied to a space between the facing member and a substrate, it is possible to form a gas flow directed outward in the radial direction from the space between the facing member and the substrate. Due to this gas flow, it is possible to reduce a processing liquid on the upper surface of a substrate going around to the lower surface side of the substrate.

While the disclosure has been shown and described in detail, the foregoing description is in all aspects illustrative and not restrictive. It is therefore understood that numerous modifications and variations can be devised without departing from the scope of the disclosure.

What is claimed is:

1. A substrate processing apparatus for processing a substrate, comprising:
   a spin base that rotates around a rotation axis extending in a vertical direction;
   a plurality of holding portions that are provided in the spin base with intervals therebetween in a rotation direction of the spin base and hold a circumferential edge portion of the substrate above the spin base;

a facing member that is disposed between the spin base and the substrate and is capable of being raised and lowered between a separated position which is separated downward from the substrate and a near position which is nearer to the substrate than the separated position; and a gas supply portion that supplies a gas to a space between the facing member and the substrate which is held by the plurality of holding portions, wherein an upper surface of the facing member comprises
- a flat surface which faces a lower surface of a part on an inner side of an outer circumferential end in a radial direction, in the circumferential edge portion of the substrate, and
- an inner surface which is provided on an inner side of the flat surface in the radial direction and is provided below the flat surface, wherein the flat surface comprises
- a plurality of pin insertion holes through which the plurality of holding portions for gripping the substrate from a side of the substrate is inserted therein, and intersects the circumferential edge portion of the substrate viewing in the vertical direction,
- a first flat part which is located on an inner side of each of the plurality of pin insertion holes in the radial direction, and
- a second flat part which is a portion of the flat surface other than the plurality of pin insertion holes and faces the lower surface comprising the outer circumferential end of the substrate, wherein the first flat part protrudes inward in the radial direction beyond other parts of the flat surface in the circumferential direction, an inclined surface is provided between the inner surface and the flat surface, wherein the inclined surface comprises
- a first inclined surface which connects to the first flat part, and a second inclined surface which connects to the second flat part, and
- a first boundary between the first flat part and the inner surface which protrudes inward in the radial direction beyond a second boundary between the second flat part and the inner surface.

2. The substrate processing apparatus according to claim 1, wherein the upper surface of the facing member comprises the inclined surface which is inclined upward to an outer side in the radial direction between the inner surface and the flat surface.

3. The substrate processing apparatus according to claim 1, wherein the flat surface of the facing member extends outward in the radial direction from a position on an inner side of the plurality of holding portions in the radial direction.

4. The substrate processing apparatus according to claim 1, wherein the flat surface extends outward in the radial direction beyond the substrate.

5. The substrate processing apparatus according to claim 1, further comprising:

a processing liquid supply portion that supplies a processing liquid to the upper surface of the substrate held by the plurality of holding portions.

* * * * *